SUPERCONDUCTING MAGNET

Filed Dec. 30, 1963

INVENTORS
HARRY E. WEAVER JR.
ROBERT J. RORDEN
BY Harry E. Aine
ATTORNEY

INVENTORS
HARRY E. WEAVER JR
ROBERT J. RORDEN
BY Harry E. Aine
ATTORNEY

United States Patent Office 3,336,526

Patented Aug. 15, 1967

3,336,526

SUPERCONDUCTING MAGNET

Harry E. Weaver, Jr., Portola Valley, and Robert J. Rorden, Palo Alto, Calif., assignors to Varian Associates, Palo Alto, Calif., a corporation of California Filed Dec. 30, 1963, Ser. No. 334,495

4 Claims. (Cl. 324—.5)

The present invention relates in general to superconducting magnets and more particularly to means for dissipating the stored energy thereof external of the coolant when the magnet undergoes a transition from the superconducting to the normal state whereby the coolant is not unnecessarily heated. Superconducting magnets are especially useful for material studies in high magnetic fields and for gyromagnetic resonance experiments.

Heretofore superconducting magnets have been constructed but these magnets have not had provisions for dissipating the stored energy contained within the superconducting solenoid external of the coolant bath upon shifting of the magnet from the superconducting state to the normal state. In the superconducting state the wire of the solenoid has zero resistance. Often times, especially when operating near critical magnetic field intensity, the magnet will unexpectedly rapidly shift from the superconducting state to the normal state. In doing so the prior art magnets have caused the energy stored in the solenoid, which may be substantial as of, for example, 8000 joules for a 55 kilogauss solenoid, to be dissipated in the solenoid producing heating thereof and evaporation of the coolant in which the solenoid is immersed. Typically the coolant is liquid helium and for an 8000 joule solenoid approximately 3 liters of helium will be evaporated. Furthermore another liter of helium is typically lost in transferring replacement liquid helium into the Dewar which surrounds the solenoid. The typical liquid helium cost of such dissipation of the stored energy in the coolant is approximately $40.00 and approximately five minutes of time is lost waiting for the superconducting solenoid to cool sufficiently to return to the superconducting state. Typically 15–20 minutes is required to transfer replacement liquid helium into the Dewar.

In the present invention a load is provided externally of the coolant. The stored energy of the superconducting magnet is dumped into the external load upon transition of the solenoid from the superconducting to the normal state. In this manner transfer of heat from the superconducting solenoid to the coolant is minimized. Such transfer in a preferred embodiment being at least 85% complete. In a preferred embodiment of the present invention the energy is dumped by means of a fast acting vacuum switch connected in series with the magnet power supply and the superconducting solenoid. The switch opens the circuit to the solenoid and allows the stored energy in the solenoid to pass into and be dissipated within a constant voltage resistive load connected in parallel with the solenoid.

In order for the transfer of energy from the solenoid to the load to be efficient the switching operation should be completed within approximately 1 millisecond after initiation of the transition of the solenoid from the superconducting to the normal state. Since such transitions occur unexpectedly a sensing device is used for sensing the beginning of the transition. A signal derived from the sensing device triggers the operation of the high vacuum switch.

In a preferred embodiment of the present invention a magnetic field responsive device is utilized for directly sensing slight changes in the magnetic field of the solenoid associated with its transition from the superconducting to normal state. A signal derived from the sensor is used for triggering the high vacuum switch in order to obtain a faster more reliable switching of the stored energy to the external load than can be obtained by sensing changes in the electrical circuit of the solenoid.

The principal object of the present invention is to provide an improved superconducting magnet having means for dissipating the stored energy of the magnet in a load external to the coolant whereby heating of the collant is minimized.

One feature of the present invention is the provision of an energy absorbing load disposed externally of the coolant used for cooling of the superconducting magnet and including means for diverting the stored energy of the solenoid into the external load whereby the stored energy is dissipated externally of the coolant to minimize unwanted heating of the coolant.

Another feature of the present invention is the same as the preceding feature including the provision of means for sensing the transition of the magnet from the superconducting state to the normal state, such sensing means controlling the transfer of the stored energy of the magnet into the external load whereby efficient transfer of the energy is obtained.

Another feature of the present invention is the same as the next preceding feature wherein the sensing device for sensing the transition from superconducting to normal state is disposed in the magnetic field of the magnet to obtain a rapid and reliable indication of the transition and to thereby enhance the efficiency of the transfer of stored energy from the superconducting magnet to the external load.

Another feature of the present invention is the same as the next preceding feature wherein said magnetic field sensing device is a Hall probe, the probe also being useful for sensing the magnitude of the magnetic field of the magnet and for sweeping and regulating the magnet field intensity.

Another feature of the present invention is the same as the first feature wherein the external load is a non-linear resistance having nearly constant voltage drop characteristics with applied current whereby overstressing of the magnet is prevented during transfer of stored energy to the external load.

Another feature of the present invention is the provision of fast acting switches in both input and output current leads connecting the power supply across a non-grounded superconducting solenoid whereby both leads are disconnected simultaneously during the transition of the solenoid from the superconducting state to the normal state to prevent shorting of the solenoid through insulation breakdown to ground in the power supply.

Other features and advantages of the present invention will become more apparent after a perusal of the following specification taken in connection with the accompanying drawings wherein.

Figure 1:
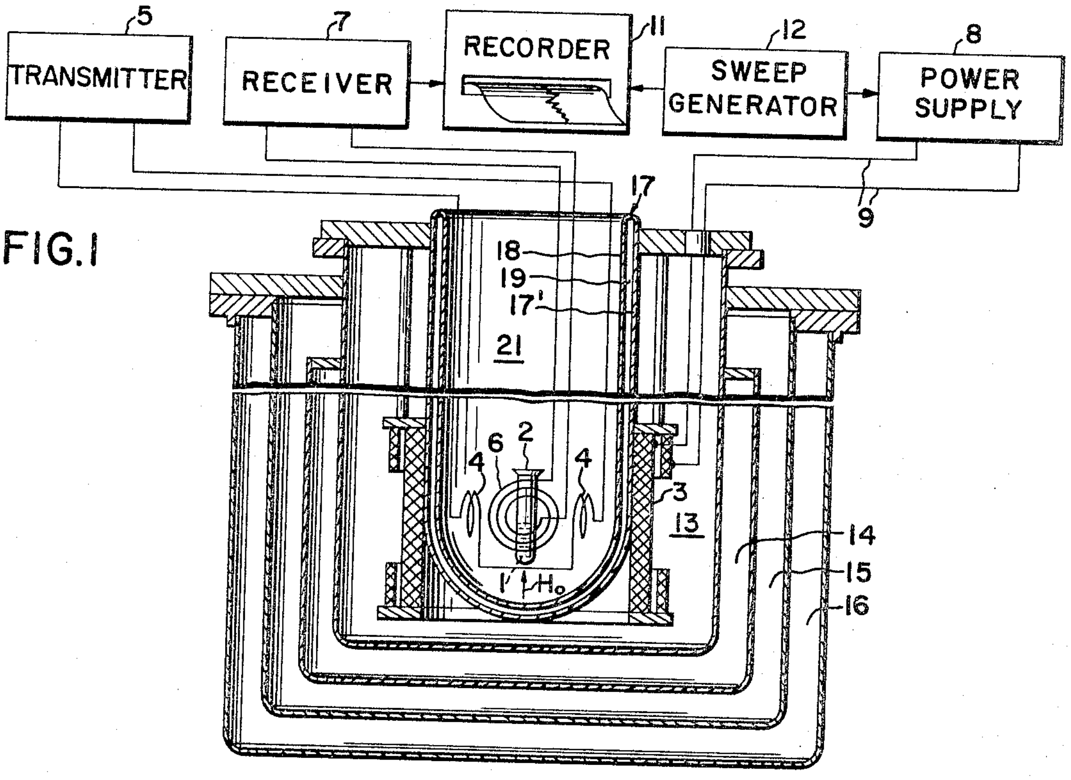
FIG. 1 is a longitudinal cross-sectional schematic diagram partly in block form of a gyromagnetic resonance spectrometer employing a superconducting magnet of the present invention.

Referring now to FIG. 1, there is shown a diagram of a gyromagnetic resonance spectrometer utilizing a superconducting magnet system. A sample of matter 1 which is to be investigated is disposed within a vial 2 and positioned within the central portion of a magnetic field $H_0$ produced by a superconducting solenoid 3. A pair of transmitter coils 4 are disposed straddling the sample 1 with their axes disposed at approximately right angles to the direction of the magnetic field $H_0$. The transmitter coils 4 are energized by R.F. wave energy derived from a transmitter 5. A detector coil 6 is disposed adjacent the sample of matter 1 with its axis oriented at approximately right angles to the axis of the transmitter coil 4 and direction of the magnetic field $H_0$. The receiver coil 6 is connected to the input of an R.F. receiver 7.

The superconducting solenoid 3 is energized from a power supply 8 via leads 9 and generates a high intensity uniform D.C. magnetic field $H_0$ as of, for example, 55–65 kilogauss over a region of 0.5" x 0.5" x 2.0". The circuits of the power supply 8 and superconducting solenoid 3 will be more fully described below.

In operation, the solenoid 3 is energized and R.F. energy derived from the transmitter 5 is applied to the sample 1 substantially at the Larmor frequency of the gyromagnetic bodies within the sample 1 under analysis thereby exciting gyromagnetic resonance of the gyromagnetic bodies. Resonance of the gyromagnetic bodies is detected by excitation of an R.F. signal in receiver coil 6 at the Larmor frequency. The resonance signal is applied to the input of the receiver 7 and is amplified and detected therein to provide an output D.C. resonance signal which is fed to and recorded by recorder 11. A gyromagnetic resonance signal spectrum of the sample under analysis is obtained by sweeping the D.C. magnetic field intensity $H_0$ through successive resonances of the groups of gyromagnetic bodies within the sample 1 by means of a sweep generator 12 which provides a sweep signal to the power supply 8 which in turn sweeps the current flowing through the solenoid 3. In addition the sweep generator supplies a signal to the recorder 11 causing the resonance signal to be recorded as a function of the sweep field. The gyromagnetic resonance signal spectrum obtained from the recorder 11 is useful for chemical analysis of the sample substance 1 under investigation.

The superconducting magnet system includes a hollow cylindrical chamber 13 surrounding the solenoid 3 and filled with a coolant at a very low temperature as of approximately 4° K. such coolant being typically liquid helium. The chamber 13 is insulated from ambient temperature by means of a plurality of coaxially nested surrounding chambers such chambers including chamber 14 which is evacuated to a very low pressure such as, for example, $10^{-6}$ millimeters to minimize thermal conduction theretbrough. Vacuum chamber 14 is surrounded by a chamber 15 containing liquid nitrogen at approximately 77° K. The liquid nitrogen chamber 15 is in turn surrounded by a second vacuum chamber 16 for minimizing thermal conduction between the outside air and the nitrogen chamber 15. The outer wall of the vacuum chamber 16 forms the outer wall of the magnet assembly and is exposed on its outer surface to atmospheric conditions.

A glass or metal Dewar 17 is disposed centrally of the superconducting solenoid 3. The outer wall of the Dewar 17 forms the inner wall of the liquid helium chamber 13. The Dewar includes two coaxially disposed and spaced apart glass or metal walls 17' and 18 with a vacuum chamber 19 disposed therebetween. The inner coaxial wall 18 defines an open ended finger like chamber 21 at ambient conditions extending down into the center of the superconducting solenoid 3. The finger like chamber 21 is open at the upper end to permit access to the magnetic field from the top. In a typical installation the superconducting solenoid 3 provides a D.C. magnetic field of up to 65 kilogauss centrally thereof. The solenoid 3 is constructed of a suitable superconducting material as of copper jacketed NbZr wire to provide a uniform field over its central region. This region of uniform field is cylindrical and is approximately ½" in diameter and 2" long.

Figures 2, 4:
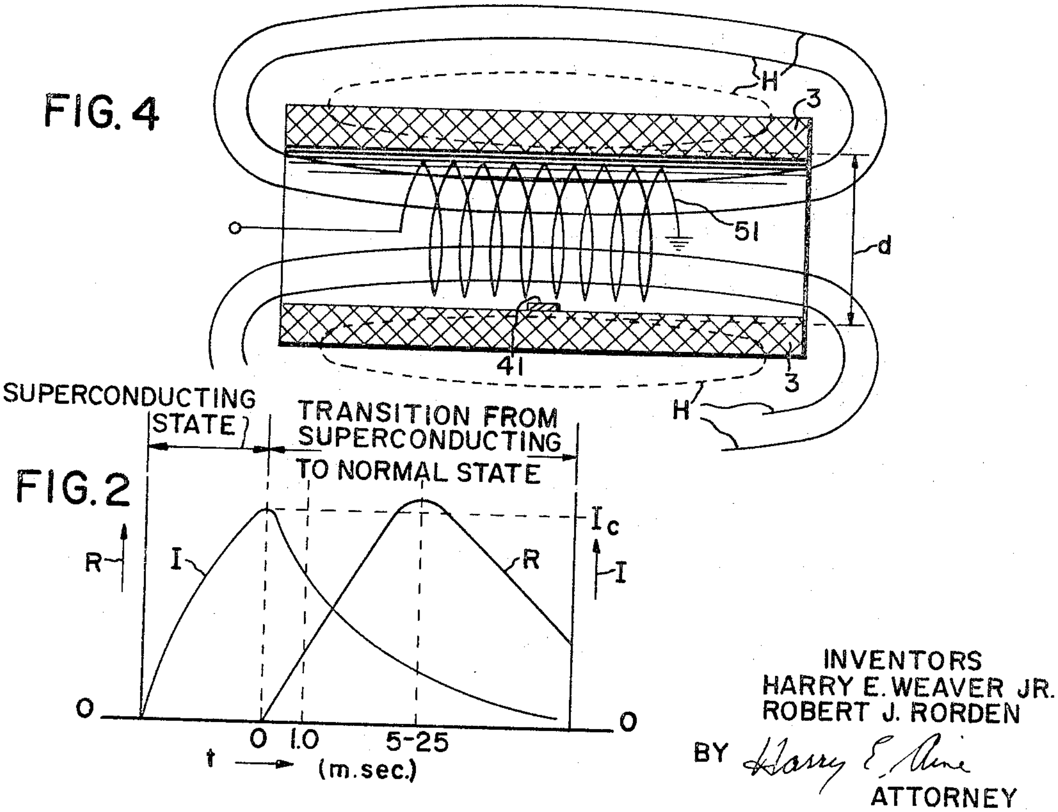
FIG. 2 is a graph of solenoid resistance and current versus time showing qualitatively the transition of the solenoid from the superconducting to the normal state.
FIG. 4 is a longitudinal cross-sectional schematic diagram of a superconducting solenoid showing the disposition of certain alternative field sensing devices.

Referring now to FIG. 2 there is shown a graph of solenoid resistance and current versus time depicting a transition from the superconducting state to the normal state. The starting time of a transition from the superconducting state to the normal state for a superconductor solenoid operating near maximum field intensity is not always predictable in advance. As the magnetic field intensity within the solenoid is increased it will reach a critical value $H_c$ at which point the solenoid will go normal. It has been found that the critical magnetic field $H_c$ can be gradually increased by causing the solenoid to pass through the superconducting to normal state transition a number of times in succession. This effect has been called "training" of the solenoid as apparently the solenoid has a memory of its magnetic history so long as the solenoid is not heated to room temperature. By training, a solenoid can have its critical field rating $H_c$ increased from, for example, 55 kilogauss to approximately 65 kilogauss. Thus going normal transitions are often desirable and often unpredictable but for every 2600 joules of stored energy dissipated in the liquid helium one liter of liquid helium will be evaporated.

The transition from the superconducting state to the normal state occurs in approximately 5 to 25 milliseconds and therefore if transfer of the energy stored in the solenoid to an external load for dissipation therein is to be effected it has been found that the transfer is preferably accomplished within a time shorter than 5 milliseconds. It has been found that if the energy is transferred within the first millisecond that approximately 85% or more of the stored energy may be transferred to the external load. The energy dumping or transfer circuit is more fully described below with regard to FIG. 3.

Figure 3:
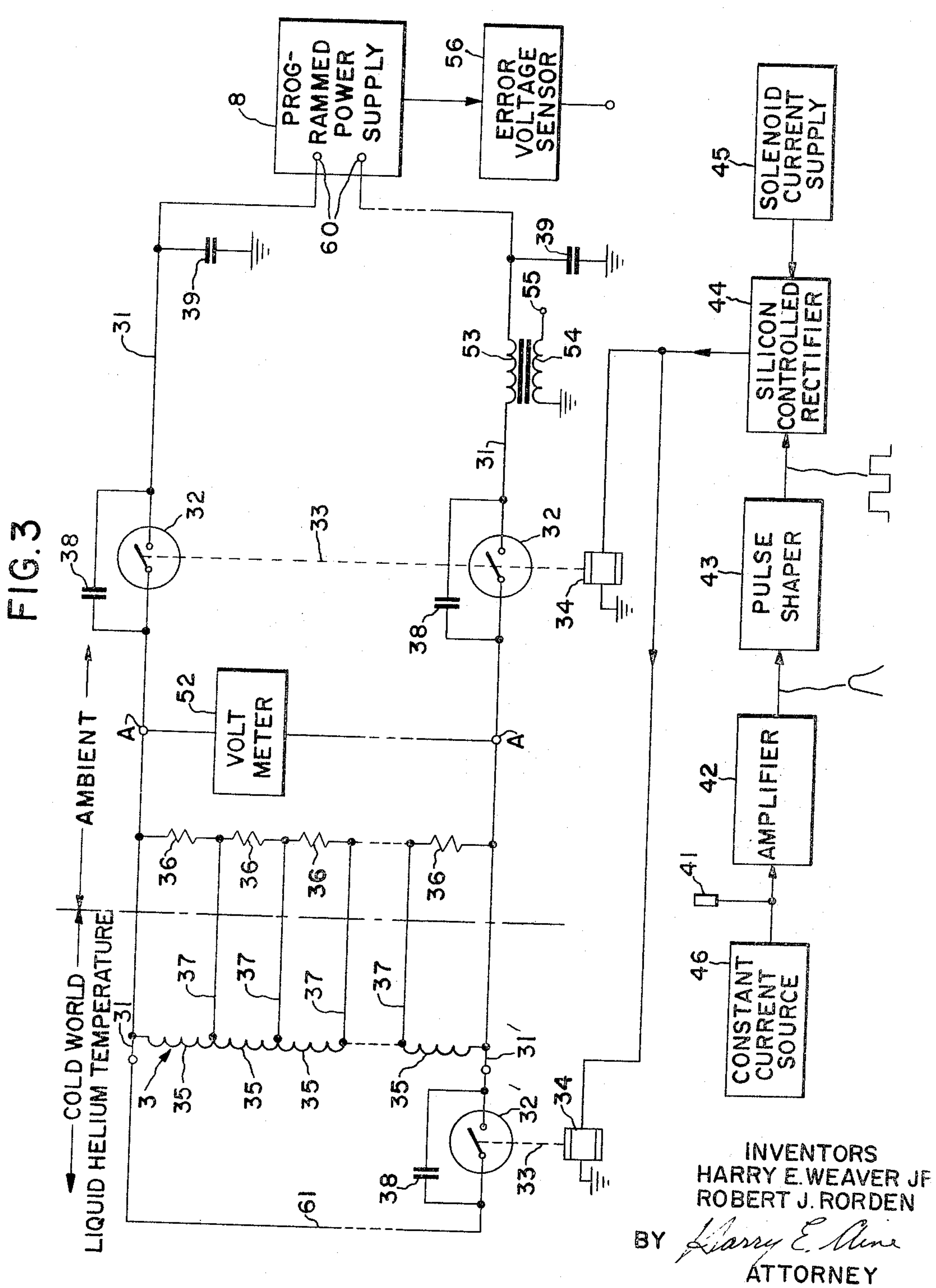
FIG. 3 is a circuit diagram in partly block diagram form of the superconducting magnet system incorporating the provisions of the present invention.

Referring now to FIG. 3 there is shown the superconducting magnet circuit which includes solenoid 3. The power supply 8, which is preferably of a regulated current type supplies a variable voltage between 0 and 6 volts at a maximum rated current of 25 amperes to the solenoid 3 via leads 31. The current is regulated by the supply 8 to one part in 1000 or $1/10^5$ and is capable of being set to or swept over a wide range up to the maximum rated value. The typical superconducting solenoid is of very high inductance. For example, a superconducting solenoid providing a magnetic field of 55–65 kilogauss contains between 25–50 h. inductance.

A pair of high vacuum high voltage fast acting switches 32 as of, for example, type R1G high vacuum switches made by Jennings Radio Manufacturing Comporation are connected in series with leads 31 between the power supply and the ends of the solenoid 3. The switches 32 are opened in a time on the order of approximately 1 millisecond by means of a mechanical linkage 33 driven from a solenoid 34. The solenoid is a typical 110 volt A.C. solenoid.

When the circuit interconnecting the power supply 8 with the superconducting solenoid 3 is rapidly opened a very high voltage appears across the ends of the solenoid 3 such voltage being in the order of 4 to 5 kilovolts for a 1 millisecond opening time and a 25–50 h. solenoid 3. A plurality of taps 35 are provided on the solenoid 3 at 2000 joule intervals of stored energy of the coil or solenoid 3. A plurality of non-linear constant voltage loads such as that provided by thyrite resistors 36 are connected shunting adjacent taps 35 via leads 37. The non-linear loads 36 are preferably selected to provide a constant maximum voltage of approximately 1000 volts at maximum current ratings of 20 amps and are preferably constructed to dissipate at least 2000 joules each. Leads 37 extend outwardly from the solenoid 3 through the helium bath to a region external of the liquid helium chamber 13. Loads 36 are preferably disposed in air such that the stored energy in the superconducting solenoid 3 which is transferred via leads 37 to the load 36 will be dissipated in the loads 36 externally of the superconducting material coolant.

Capacitors 38 as of 500 pf. and 5 kilovolts rating are connected shunting the high vacuum switches 32 to permit high frequency Fourier components of the transient current to bypass the high vacuum switches upon opening of the switches 32. In addition capacitors 39 as of 0.01 μf. are connected between the leads 31 and ground for permitting the high frequency Fourier switching transient currents to bypass the power supply 8 to prevent damage thereof during the switching operation.

In a preferred embodiment of the present invention the entire circuit floats with respect to ground. In this way increased assurance is obtained that a voltage breakdown in the insulation of the solenoid will not cause shorting of the solenoid 3 since in order to short out a portion of the solenoid via ground two breakdowns to the common ground would be required. If the solenoid were grounded at one point, only one insulation breakdown between ground and the solenoid would be required to short out the solenoid.

When the magnet circuit floats with respect to ground it is preferred to use two fast acting switches 32, one switch in each lead connecting the power supply 8 across the solenoid 3. The reason for using two switches 32 is that otherwise opening just one of the leads 31 might produce voltage breakdown from the solenoid to ground which could produce a high voltage transient surge through the power supply via the other lead to ground. This latter surge through the power supply could produce breakdown of the power supply insulation causing substantial stored energy of the solenoid to be dissipated in the power supply causing destruction of its components, such as transistors. Thus to prevent these problems in the power supply 8 dual switches 32 are provided for completely isolating the power supply from the solenoid 3 upon switching the stored energy of the solenoid to the external load 36.

Switches 32 are controlled or triggered by means of a sensor which senses transients associated with shifting of the solenoid 3 from the superconducting state to the normal state. In a preferred embodiment a Hall probe sensor 41 is disposed within the central region of the solenoid 3, either inside the helium chamber 13 or within the finger chamber 21, for directly sensing slight changes in the magnetic field associated with the transition of the solenoid from the superconducting to the normal state. Transient field changes produce transient signals in the Hall probe which are amplified by amplifier 42 and passed to a pulse shaper 43. The pulse shaper reshapes transient signals to provide a proper signal for triggering a silicon controlled rectifier 44 connected in circuit between the switch operating solenoid 34 and a switch solenoid current supply 45.

The switch solenoid current supply 45, in a preferred embodiment, stores approximately 1000 joules of energy at 250 volts as by means of a large capacitor, not shown. The silicon controlled rectifier when triggered by the pulse derived from pulse shaper 43 closes the circuit between the switch solenoid current supply 45 and the solenoid 34 allowing the stored energy to pass therethrough and to open the high vacuum switches 32. Upon opening of the switches 32 the energy stored within the superconducting solenoid 3 is caused to pass to the nonlinear loads 36 and to be dissipated therein.

The Hall probe 41 is supplied from a constant current source 46 providing approximately 100 milliamps of current through a series resistor over a voltage range between 10 and 100 volts. In a preferred embodiment the Hall probe 41 is a model SBV–552 probe manufactured by Siemens and Halske Aktiengesellschaft. The use of a Hall probe 41 for sensing transient changes in the magnetic field is especially advantageous in this combination as it allows the probe 41 to also serve as a field regulator sensor or field measuring sensor and sensor for controlling the sweep of the magnetic field intensity in the manner as described in assignee's copending application titled Magnetic Field Sensing Device, filed Jan. 21, 1963, U.S. Ser. No. 252,939, now issued as U.S. Patent 3,267,368 on Aug. 16, 1966.

As an alternative embodiment to the use of the Hall probe 41 for sensing the transition from superconducting to normal state a coil 51 may be disposed in the field of the superconducting magnet to function like a secondary of a transformer. Fluctuations in the magnetic field which accompany the transition from superconducting to normal state produce transient signals in the coil 51, as previously explained with regard to the Hall probe 41, such transient signals are amplified and used to control or trigger operation of the high vacuum switches 32, as previously described. As with the probe 41, coil 51 has the advantage of being a direct indication of fluctuations of the magnetic field of the solenoid 3 which is preferred to detection of fluctuations in the current or voltages of the electrical circuit of the solenoid 3.

Another alternative sensing device for sensing the transitions from the superconducting to the normal state of the solenoid 3 includes means for detecting voltage changes across the solenoid 3. Such sensing means include a voltmeter 52 connected across the solenoid 3 at points A—A in leads 31. The output of the voltmeter 52 is used as previously described, to control switches 32 via amplifier 42, pulse shaper 43 and silicon controlled rectifier 44.

Another alternative means for sensing the solenoid's transition from superconducting to normal state includes a transformer 53 having the primary connected in series with one of the leads 31 and the secondary winding 54 providing an output signal at terminal 55 for controlling switches 32 via amplifier 42, pulse shaper 43, and silicon controlled rectifier 44, as previously described.

Another alternative for sensing the transition of the superconducting solenoid 3 from the superconducting state to the normal state includes an error voltage sensor 56 for sensing the error voltage in the solenoid power supply 8. The output of the error voltage sensor 56 is applied as above described for control of switches 32 via amplifier 42, pulse shaper 43, and silicon controlled rectifier 44.

The aforementioned magnetic field sensors 41 and 51 are preferred to transition sensors 52, 53 and 56 because they sense directly changes in the magnetic field of the solenoid which are present before changes in the electrical circuit external of the solenoid occur. It turns out that a solenoid in the superconducting state differs from a solenoid in a normal state in one very important way. In the normal state the magnetic field lines of the solenoid readily pass through the conductors which form the solenoid. However, in a fully superconducting state solenoid the magnetic field lines do not pass through any portion of the conductors forming the solenoid. As the solenoid approaches its critical field $H_c$ a small fraction of the solenoid goes normal and therefore a small fraction of the total number of magnetic field lines will pass through the normal state portions of the conductors of the solenoid as shown by the dotted line of FIG. 4.

The total number of magnetic field lines generated by the solenoid need not change when the solenoid is in a condition approaching the transition $H_c$ for the entire solenoid. The area through which these magnetic field lines increases slightly to include some of the conductor regions while the total number of field lines remains constant such that the magnetic field intensity decreases slightly due to the increase in area through which these lines pass as indicated by the increased dimensions *d* of FIG. 4.

When this slight decrease in magnetic field intensity occurs the electrical circuit external of the solenoid shows no indication of the changes occurring in the solenoid. However, a sensing device which operates directly upon the magnetic field lines of the solenoid will detect the transient signals as the magnetic field shifts about inside the solenoid due to certain of the field lines passing through normal state parts of the conductors forming the solenoid. Thus a sensing device operating directly upon the magnetic field of the solenoid gives an earlier indication of the impending transition from the superconducting state to the normal state such that a more efficient transfer of the energy from the solenoid 3 to the external load 36 is facilitated.

Moreover, sensing devices operating upon sensing the fluctuations in voltage or current supplied to the solenoid 3 tend to be cancelled or masked because the power supply is of the constant current type tending to cancel out any fluctuations in the current drawn by the solenoid 3. Furthermore, sensing devices such as the voltmeter 52 and the error voltage sensor 56 tend to be responsive to current supply ripples of the constant current supply 8. For example, a typically constant current power supply 8 has current regulation to 1 part in 1000 but such very small ripple is multiplied by the large inductive reactance of the solenoid 3 such that the one part in 1000 current supply 120 c.p.s. ripple has a magnitude of approximately 1 volt ripple across terminals A—A. Thus sensors operating upon the power supply or upon the circuit interconnecting the power supply and the superconducting solenoid 3 can be inadvertently triggered by current supply transients.

The present invention is also applicable to superconducting magnets operating in the persistent mode. In such a case the power supply 8 would be disconnected from the solenoid 3 at one of its terminals 60 after energization of the solenoid and a superconducting short 61 would shunt across the sections of the solenoid 3 via leads 31'. Sensors 41, 51, or 53 sensing a transition to the normal state would open switch 32' in the short 61 as previously described to divert the stored energy of the solenoid 3 into the external loads 36.

Since many changes can be made in the above construction and many apparently widely different embodiments of this invention could be made without departing from the scope thereof, it is intended that all matter contained in the above descripiton or shown in the accompanying drawings shall be interpreted as illustrative and not in a limiting sense.

What is claimed is:

1. A superconductive magnet apparatus including a solenoid made of a material having superconductive properties at cryogenic temperatures, a power supply connected in circuit with said solenoid for energizing same, a coolant for cooling said solenoid to a sufficiently low temperature to put said solenoid in a superconducting state, an energy absorbing non-linear resistive load characterized by an increasing resistance with decreasing current drawn therethrough disposed externally of said coolant for dissipating the stored energy of said superconductive solenoid, and switch means connected in circuit between said power supply and said solenoid for disconnecting said power supply from said solenoid and for diverting the stored energy of said solenoid into said external nonlinear energy absorbing load, whereby the stored energy of said solenoid may be dissipated without overstressing of said solenoid during transfer of the stored energy.

2. The apparatus according to claim 1 including means for sensing a transition of said superconducting solenoid from the superconducting state to the normal state and for triggering said switch means and opening said switch means within 5 milliseconds after said solenoid starts its transition to cause said switch means to disconnect said power supply from said superconducting solenoid.

3. The apparatus of claim 2 wherein said sensing means includes a Hall probe surrounded by and coupled to the magnetic field of said superconductive solenoid and generating an electrical signal in direct response to fluctuations in the intensity of the magnetic field within said solenoid, an amplifier and a pulse shaper for amplifying and shaping electrical signals generated by said Hall probe, said switch means including a vacuum switch, a second solenoid connected by a mechanical linkage to said vacuum switch for driving same to the open position, a switch solenoid current supply for energizing said second solenoid, and a silicon controlled rectified for controlling energization of said switch solenoid and being triggered by said Hall probe signal as derived from the output of said pulse shaper for opening said vacuum switch in a time shorter than 5 milliseconds after onset of the transition of said solenoid to the normal state, whereby the stored energy may be quickly and reliably transferred from said superconductive solenoid to said nonlinear energy absorbing load.

4. The apparatus according to claim 1 wherein said solenoid is formed by a plurality of coil sections and said load is formed by a plurality of load sections, and separate ones of said coil sections being connected to separate ones of said non-linear energy absorbing load sections disposed externally of said coolant.

References Cited

UNITED STATES PATENTS

| | | | |
|---|---|---|---|
| 3,080,527 | 3/1963 | Chester | 330—4 |
| 3,176,195 | 3/1965 | Boom et al. | 317—123 |
| 3,183,413 | 5/1965 | Riemersma | 317—123 |
| 3,214,637 | 10/1965 | Persson | 317—9 |

FOREIGN PATENTS

| | | |
|---|---|---|
| 183,121 | 4/1963 | Sweden. |

OTHER REFERENCES

Kropschot et al., Cryogenics, vol. 2, No. 1, September 1961, pp. 1–15 incl.

Crampton et al., Engineering, vol. 196, July 26, 1963, pp. 126 and 127.

Mitchell et al., The Review of Scientific Instruments, vol. 28, No. 8, August 1957, pp. 624–628.

Smith, The Review of Sci. Instrs., vol, 34, No. 4, April 1963, pp. 368–373 incl.

McEvoy, et al., The Review of Sci., Instrs., vol. 34, No. 8, August 1963, pp. 914–917 incl.

RUDOLPH V. ROLINEC, *Primary Examiner.*

CHESTER L. JUSTUS, MAYNARD R. WILBUR, *Examiners.*

A. E. RICHMOND, M. J. LYNCH, *Assistant Examiners.*